(12) United States Patent
Kulkarni

(10) Patent No.: US 11,440,523 B2
(45) Date of Patent: Sep. 13, 2022

(54) DETECTING ELECTRIC OVER HYDRAULIC TRAILER CONNECTIVITY

(71) Applicant: HORIZON GLOBAL AMERICAS INC., Plymouth, MI (US)

(72) Inventor: Chandrakumar D. Kulkarni, Battle Creek, MI (US)

(73) Assignee: HORIZON GLOBAL AMERICAS INC., Plymouth, MI (US)

(*) Notice: Subject to any disclaimer, the term of this patent is extended or adjusted under 35 U.S.C. 154(b) by 368 days.

(21) Appl. No.: 16/603,265

(22) PCT Filed: Apr. 10, 2018

(86) PCT No.: PCT/US2018/026848
§ 371 (c)(1),
(2) Date: Oct. 7, 2019

(87) PCT Pub. No.: WO2018/191239
PCT Pub. Date: Oct. 18, 2018

(65) Prior Publication Data
US 2021/0101578 A1   Apr. 8, 2021

Related U.S. Application Data

(60) Provisional application No. 62/483,493, filed on Apr. 10, 2017.

(51) Int. Cl.
*B60T 17/22* (2006.01)
*G01R 31/68* (2020.01)
*B60Q 9/00* (2006.01)

(52) U.S. Cl.
CPC .............. *B60T 17/221* (2013.01); *B60Q 9/00* (2013.01); *G01R 31/68* (2020.01); *B60T 2270/406* (2013.01)

(58) Field of Classification Search
CPC ..... B60T 7/00; B60T 7/20; B60T 8/17; B60T 8/171; B60T 8/172; B60T 8/1708;
(Continued)

(56) References Cited

U.S. PATENT DOCUMENTS 3,967,863 A * 7/1976 Tomecek .............. B60T 8/1708
   303/24.1
4,398,252 A * 8/1983 Frait ..................... B60T 13/741
   188/3 R (Continued)

OTHER PUBLICATIONS

International Search Report and Written Opinion dated Jul. 2, 2018; International Patent Application No. PCT/US2018/026848 filed Apr. 10, 2018. ISA/US.

*Primary Examiner* — Russell Frejd
*Assistant Examiner* — Brandon Z Willis
(74) *Attorney, Agent, or Firm* — McDonald Hopkins LLC

(57) ABSTRACT

A brake controller system includes a brake controller that controls the brakes of a towed vehicle based on acceleration. The brake controller sends signals to the brakes of the towed vehicle. The brake controller sends signals to determine whether the trailer brakes are properly connected. The signals may include a pulse train. The pulse train charges hydraulic braking systems for resistive testing. The brake controller determines whether the brakes are connected.

20 Claims, 7 Drawing Sheets

(58) Field of Classification Search
CPC ........ B60T 13/66; B60T 13/662; B60T 13/74; B60T 13/745; B60T 13/748; B60T 17/22; B60T 17/221; B60T 2270/406; B60Q 9/00; G01R 27/02; G01R 31/68; G01R 31/66; G01R 31/50
See application file for complete search history.

(56) References Cited

U.S. PATENT DOCUMENTS

| | | | |
|---|---|---|---|
| 5,620,236 A | 4/1997 | McGrath et al. | |
| 7,114,786 B2* | 10/2006 | Bess | B60T 13/66 303/7 |
| 2005/0127747 A1* | 6/2005 | Robertson | B60T 13/74 303/20 |
| 2008/0143179 A1* | 6/2008 | Rutherford | B60T 7/20 303/160 |
| 2014/0288795 A1* | 9/2014 | Albright | B60T 8/885 701/70 |
| 2017/0305402 A1* | 10/2017 | Vinci | B60T 17/221 |

\* cited by examiner

DETECTING ELECTRIC OVER HYDRAULIC TRAILER CONNECTIVITY

CROSS-REFERENCE TO RELATED APPLICATION

This application is a 35 U.S.C. 371 national stage filing of PCT Application No. PCT/US2018/026848 filed Apr. 10, 2018 and entitled "DETECTING ELECTRIC OVER HYDRAULIC TRAILER CONNECTIVITY," which claims priority to U.S. Provisional Patent Application No. 62/483,493 entitled "DETECTING ELECTRIC OVER HYDRAULIC TRAILER CONNECTIVITY," filed on Apr. 10, 2017, each of which are incorporated herein by reference in their entirety.

TECHNICAL FIELD

This disclosure relates to a brake controller device, a system and a method for controlling detecting trailer connectivity of a trailer with hydraulic brakes, and, more specifically, a brake controller device with automated detection of electric over hydraulic trailer connectivity is described herein.

BACKGROUND

A variety of brake controllers may be employed to control the brakes of a towed vehicle. Typically, the brake controller may actuate the towed vehicle's brakes in response to braking by the towing vehicle. These brake controllers may often include accelerometers and microprocessors which may measure and/or take into account a variety of conditions (e.g., braking signal, acceleration, etc.), whereby the brake controller may apply the towed vehicle's brakes in such a manner that assists in stopping the towing vehicle and towed vehicle, and may also reduce the likelihood of an unsafe driving condition.

The brake controller is often mounted to the towing vehicle. Typically, the brake controller may be hard-wired to the towing vehicle, such as being mounted in the cab or passenger compartment of the towing vehicle. The brake controller may communicate with the brake system of the towed vehicle by means of a wiring system that may provide communication between the towing vehicle's brake system and the towed vehicle's brake system.

In some instances, the brake controller controls the brakes of a trailer that has electric brakes or a trailer that implements hydraulic brakes. Some brake controllers sense connectivity of electric brakes (e.g., brake electromagnetics) but do not sense the presence of hydraulic brakes. These brake controllers may allow a user to manually select when they are using a trailer with hydraulic brakes.

Therefore, there is a need in the art for a more efficient brake controller. The brake controller may automatically test connectivity of a trailer that uses a hydraulic braking system. There is also a need for a brake controller that may automatically adjust a transfer function between the input and output based on operating conditions.

DETAILED DESCRIPTION

Figure 1:
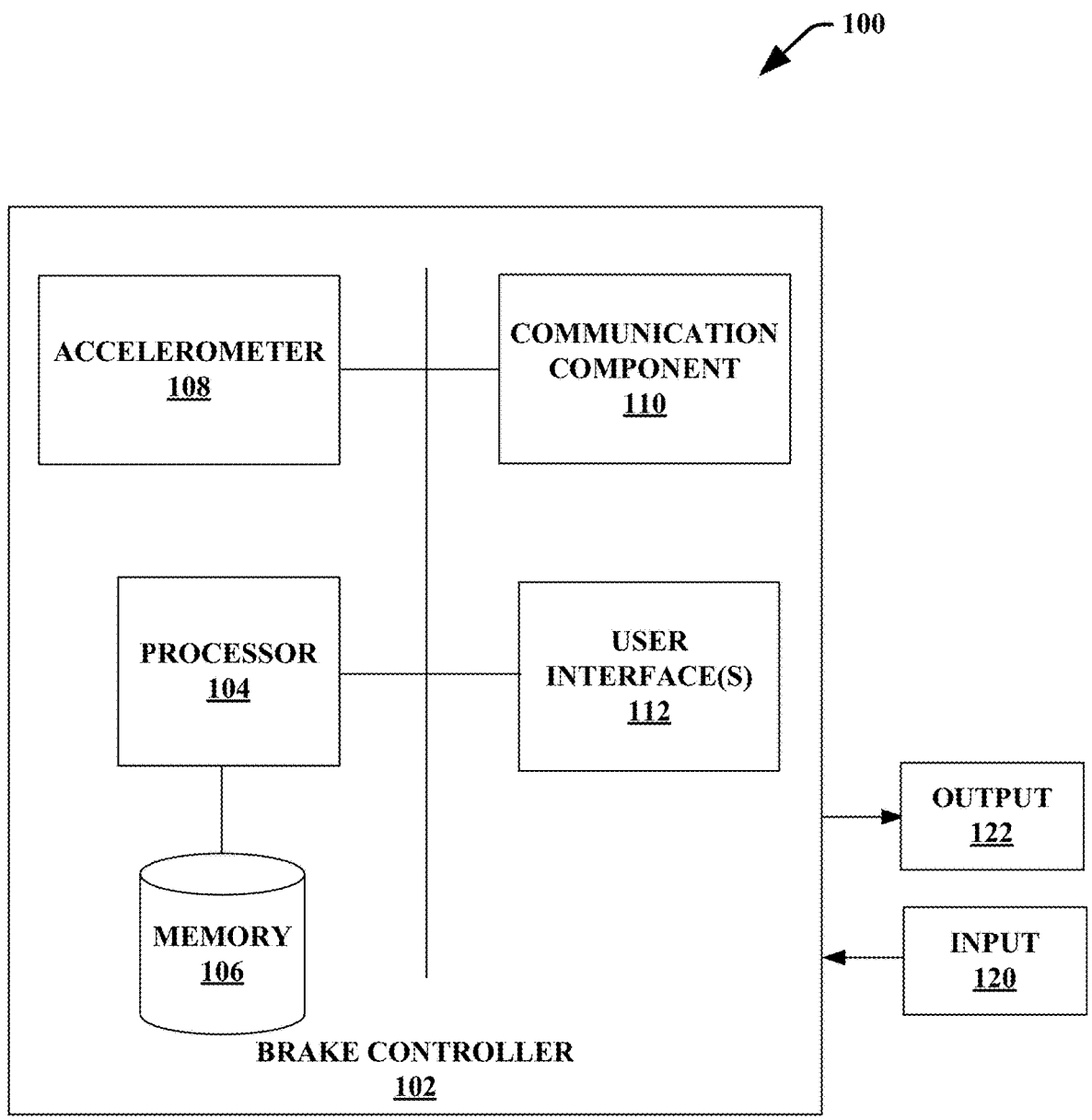
FIG. 1 is a functional schematic diagram of a brake controller system of the present disclosure.

Reference will now be made in detail to exemplary embodiments of the present invention, examples of which are illustrated in the accompanying drawings. It is to be understood that other embodiments may be utilized and structural and functional changes may be made without departing from the respective scope of the invention. Moreover, features of the various embodiments may be combined or altered without departing from the scope of the invention. As such, the following description is presented by way of illustration only and should not limit in any way the various alternatives and modifications that may be made to the illustrated embodiments and still be within the spirit and scope of the invention.

As used herein, the words "example" and "exemplary" mean an instance, or illustration. The words "example" or "exemplary" do not indicate a key or preferred aspect or embodiment. The word "or" is intended to be inclusive rather than exclusive, unless context suggests otherwise. As an example, the phrase "A employs B or C," includes any inclusive permutation (e.g., A employs B; A employs C; or A employs both B and C). As another matter, the articles "a" and "an" are generally intended to mean "one or more" unless context suggest otherwise.

"Logic" refers to any information and/or data that may be applied to direct the operation of a processor. Logic may be formed from instruction signals stored in a memory (e.g., a non-transitory memory). Software is one example of logic. In another aspect, logic may include hardware, alone or in combination with software. For instance, logic may include digital and/or analog hardware circuits, such as hardware circuits comprising logical gates (e.g., AND, OR, XOR, NAND, NOR, and other logical operations). Furthermore, logic may be programmed and/or include aspects of various devices and is not limited to a single device. Furthermore, the terms "user," "customer," "consumer," and the like are employed interchangeably throughout the subject specification, unless context suggests otherwise or warrants a particular distinction among the terms. It is noted that such terms may refer to human entities or automated components supported through artificial intelligence (e.g., a capacity to make inference). As such, embodiments may describe a user action that may not require human action.

"User equipment," "device," "user equipment device," "client," and the like are utilized interchangeably in the subject application, unless context warrants particular distinction(s) among the terms. By way of example, user equipment may comprise an electronic device capable of wirelessly sending and receiving data. A user equipment device may have a processor, a memory, a transceiver, an input, and an output. Examples of such devices include cellular telephones (e.g., smart phones), personal digital assistants (PDAs), portable computers, tablet computers (tablets), hand held gaming counsels, wearables (e.g., smart watches), global positioning system (GPS) devices, and the like.

As used herein, a towing vehicle may include various types of automobiles (e.g., car, truck, SUV, recreational vehicle ("RV"), etc.). A towed vehicle may include trailers (e.g., agricultural trails, boat trailers, horse trailer, etc.), an automobile, or the like. It is noted that various combinations of towed vehicles and towing vehicles may utilize some or all aspects of this disclosure.

Disclosed embodiments may refer to a brake controller, brake controller device, or the like. Such terms are used interchangeably to describe electronic devices that control the brakes of a trailer or towed vehicle. Examples of such controller can be found in U.S. Pat. Nos. 9,150,201; 8,789, 896; 8,746,812; and 6,615,125, all of which are incorporated by reference. For instance, a brake controller may comprise a unit that is mounted in or on a towing vehicle. The towing vehicle is attached to a towed vehicle (e.g., via a hitch or the like). The towing vehicle may pull, push, or otherwise tow the towed vehicle. The brake controller system may monitor acceleration and application of a brake pedal to control the brakes of the towed vehicle to operatively apply (e.g., engage, release, etc.) the towed vehicle brakes. Moreover, while embodiments may refer to a brake controller system comprising various components, such components may be a single device or multiple devices in communication with each other. For example, a brake controller may include a display, a processing unit, and an accelerometer. These components may be comprised within a single housing or in multiple housings. In another aspect, the brake controller may include controls or user interfaces (e.g., buttons, knobs, switches, etc.) that may allow a user to interact with the brake controller. These controls may be disposed directly on a main housing or may be disposed on a hand control unit communicatively coupled to the main housing. The components may include wiring, circuitry, or the like. In at least one embodiment, different components of the brake controller may be mounted in or on various parts of a towing or towed vehicle. It is noted that the brake controller may include other components that provide for various other features. For instance, a brake controller system may include anti-sway devices, converters, trailer breakaway systems, tire pressure monitoring systems for trailers, vehicle speed monitoring systems, user equipment devices, internet or network connected devices, external cameras, and the like. Examples of a brake controller system may be found in U.S. Pat. No. 9,738,125, which is incorporated by reference herein.

Disclosed embodiments may include user interfaces. As used herein, a user interface may include devices that receive input from a user and transmit the input to electronic circuitry, such as a microprocessor, or outputs information to a user. Such user interfaces may include buttons, switches, knobs, touch screens (e.g., capacitive touch screens), microphones, image capturing devices, motion sensors, pressure sensors, a display screen, a speaker, a light (e.g., LED, bulb, etc.), or the like. For brevity, examples may be described with reference to a user interface in general rather than any particular type of user interface. It is noted, however, that brake controllers may include multiple user interfaces of various types, including without limitation those identified above.

Networks or communication networks may include wired or wireless data connections to a network (e.g., Ethernet, Wi-Fi, cellular network, local area connections, etc.). Embodiments, for example, may utilize various radio access networks (RAN), e.g., Wi-Fi, Wi-Fi direct, global system for mobile communications, universal mobile telecommunications systems, worldwide interoperability for microwave access, enhanced general packet radio service, third generation partnership project long term evolution (3G LTE), fourth generation long term evolution (4G LTE), third generation partnership project 2, BLUETOOTH®, ultra mobile broadband, high speed packet access, xth generation long term evolution, or another IEEE 802.XX (technology. BLUETOOTH (in any of its various iterations), various wireless technologies for exchanging data over short distances (e.g., ZigBee, RuBee, DASH7, etc.), and other protocols and personal area networks may be utilized. Wireless communication may also include, in whole or in part, communications transmitted over more traditional local area networks (including such networks provided by the vehicle and/or trailer/towed product) or cellular data networks, so as to incorporate aspects of cloud-based computing systems, information available via world wide web and other internet connectivity, and the like. As such, any indication of "wireless," "Wi-Fi," or other similar terminology should be read expansively (at least within the context it is used) throughout this disclosure. Moreover, embodiments may use one or more different communications protocols or devices (whether wired or wireless) to communicate between the various components of the system.

A brake controller for controlling brakes of a towed vehicle is described herein. The brake controller may comprise a processor that operatively initiates transmission of a test signal for testing the connectivity of the brakes of the towed vehicle, an output driver circuit operatively coupled to the processor and configured to receive the test signal and initiate application of an electronic signal to the brakes and to measure a resistance induced in the brakes, wherein, in response to determining that the resistance is within at least one of a first range or a second range, the processor identifies the brakes as connected, and wherein, in response to the determining that the resistance is not within at least one of the first range or the second range, the processor generates a pulse train to be applied to the brakes, iterates transmission of the test signal, and determines whether the resistance is within the second range corresponding to electronic over hydraulic brakes connected to the brake control unit. The processor may identify the brakes as not connected when the resistances is not within the first range or the second range. In at least one aspect, the processor may generate the pulse train with a pulse period of about 2 ms, a pulse width of about 100 µs, and may repeat the pulse train once every 250 msec. In examples, the processor generates pulses of the pulse train such that the time period between consecutive pulses is about 2 msec or about 250 msec. For instance, the pulse train may be about 50*(2 ms+100 µs)=105 ms. In another example, the processor measures inductance at the output driver circuit and determines whether the inductance indicates that electromagnetic brakes are present. Moreover, the first range comprises at least one of a value associated with electromagnetic brakes or a value associated with hydraulic brakes. The brake controller may comprise a user interface coupled to the processor and operatively indicating a connectivity status to the trailer brakes. In another aspect, the brake controller may comprise a memory, wherein the processor stores a type associated with the trailer brakes in the memory.

Also described herein is a brake controller for determining connectivity of the trailer brakes. A brake controller for determining connectivity of trailer brakes comprising, a processor, and an output driver circuit selectively coupled to the trailer brakes, wherein the processor generates a pulse train to be applied to a trailer brake system, the pulse train comprising a plurality of pulses that operatively charge an input circuit of the trailer brake system if the trailer brake system is operatively connected, and wherein the processor measures resistance at the output driver circuit after application of the pulse train to determine whether the trailer brake system is operatively connected. The processor may periodically iterate generation of the pulse train and measuring the resistance at the output driver circuit. The output driver circuit may operatively receive the pulse train from the processor and applies the pulse train to a terminal connection that is operatively connected to the trailer brake system.

A described method for determining connectivity of trailer brakes to a brake controller may comprise generating a resistive test signal to be applied to a connection terminal of an output circuit of the brake controller, measuring resistance at the output circuit, in response to determining that the resistance is within a first range, identifying the trailer brakes as properly connected, in response to determining that the resistance is not within the first range, generating a pulse train to be applied to the connection terminal of the output circuit, measuring resistance at the output circuit after application of the pulse train, and determining the connectivity of the trailer brakes based on the measured resistance. The method may further include generating an inductive test signal to be applied to the connection terminal of the output circuit. The method may further include measuring inductance at the output circuit in response to the inductive test signal and determining whether the trailer brakes are properly connected. In another aspect, the method may include comprising indicating a connectivity status of the trailer brakes through a user interface. Moreover, the method may include storing a type associated with the trailer brakes in response to determining that the trailer brakes are properly connected.

The foregoing embodiments are merely exemplary of some of the aspects of the system. Additional features and elements may be contemplated and described herein. Also, features from one of the foregoing embodiments may be combined with features from any of the other foregoing embodiments.

Turning now to FIG. 1, there is a functional block diagram of a brake controller system 100 for controlling trailer brakes of a towed vehicle in accordance with various disclosed embodiments. As described herein, the brake controller system 100 may be a proportional, inertia, or timer based system for a towing and towed vehicle system.

Brake controller system 100 may primarily include a processor 104, a memory 106, an accelerometer 108, a communication component 110, and user interface(s) 112. It is noted that memory 106 may store computer executable instructions which may be executed by processor 104. In an aspect, instructions may include control instructions that control or instruct the various components described herein. Furthermore, while embodiments may reference user actions, it is noted that users (e.g., humans, etc.) may not be required to perform such actions. Exemplary, non-limiting brake controller units are disclosed in U.S. Pat. Nos. 6,012, 780; 6,068,352; 6,282,480; 6,445,993; 6,615,125; 8,746, 812; 8,789,896; and 9,150,201.

The accelerometer 108 may comprise an inertia sensor, such as a single or multi-axis accelerometer (e.g., two-axis, three-axis, etc.), gyroscope, or the like. It is noted that various types of accelerometers may be utilized. The accelerometer 108 may comprise circuitry or mechanical components that are responsive to changes in forces, such as changes in acceleration. The accelerometer 108 may be communicated to other components of the brake controller 102 such as the processor 104.

Figure 2:
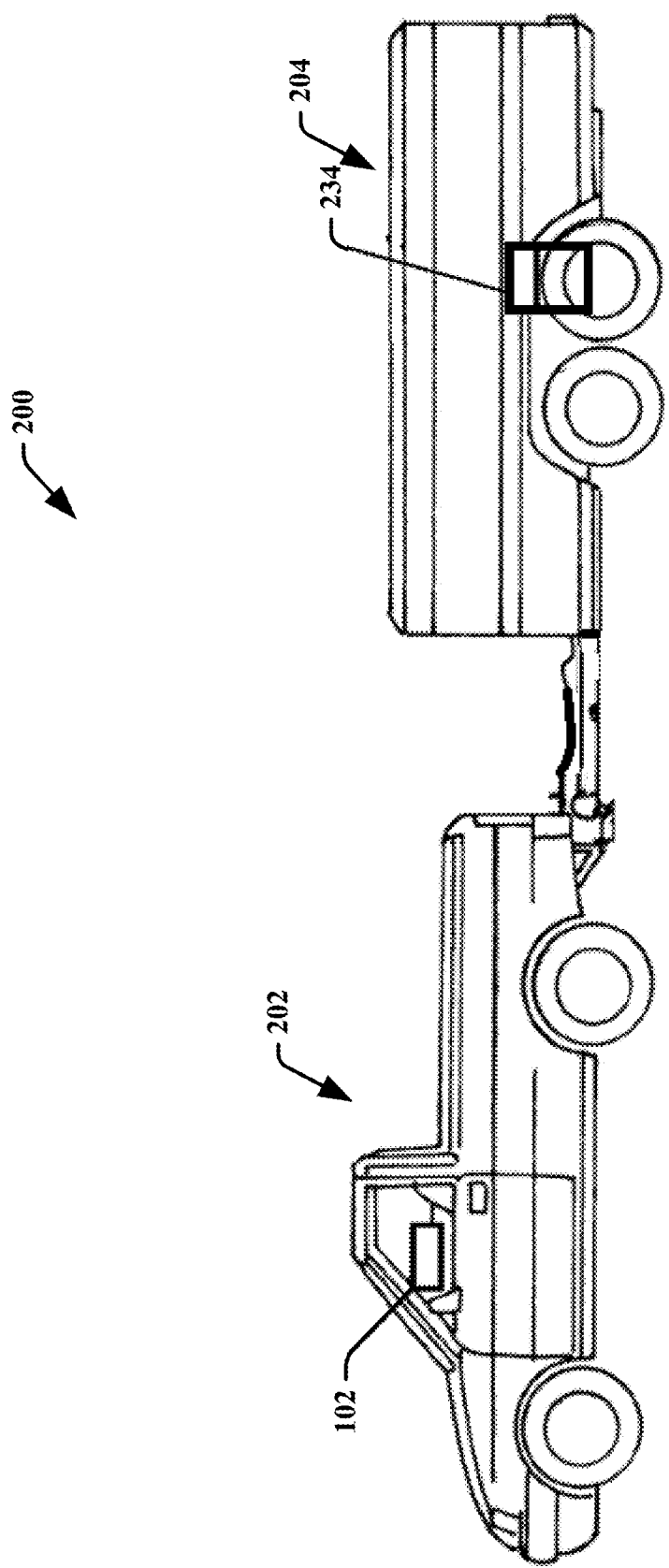
FIG. 2 is a schematic side view of an embodiment of a brake controller system with a towing and towed vehicle in accordance with the present disclosure.
Figure 3:
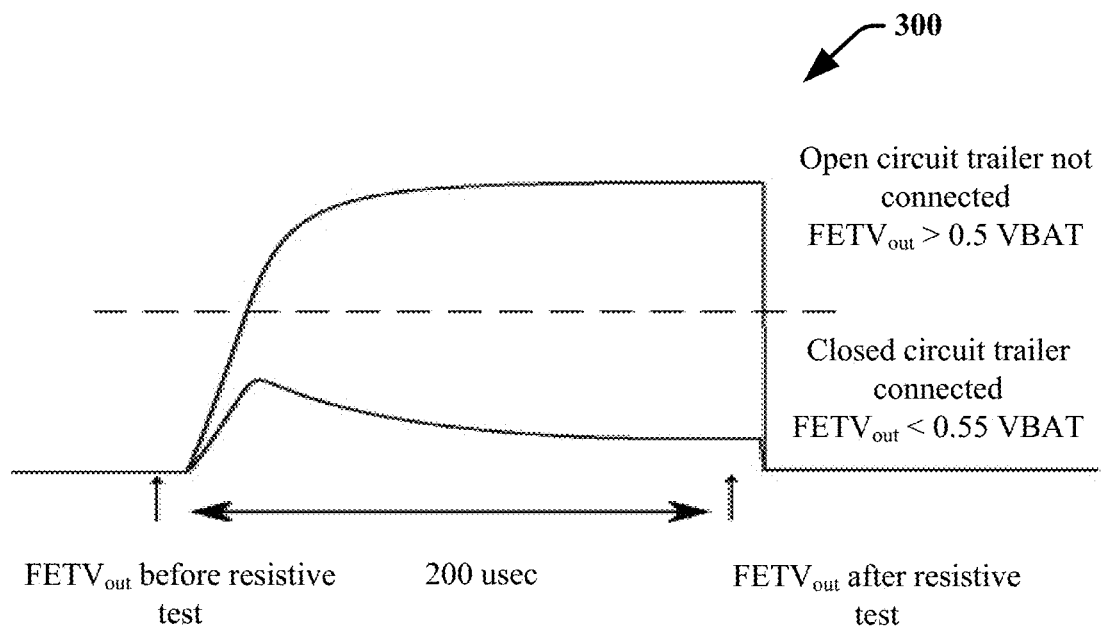
FIG. 3 is a graph depicting an initial measurement of an output voltage in accordance with the present disclosure.
Figure 4:
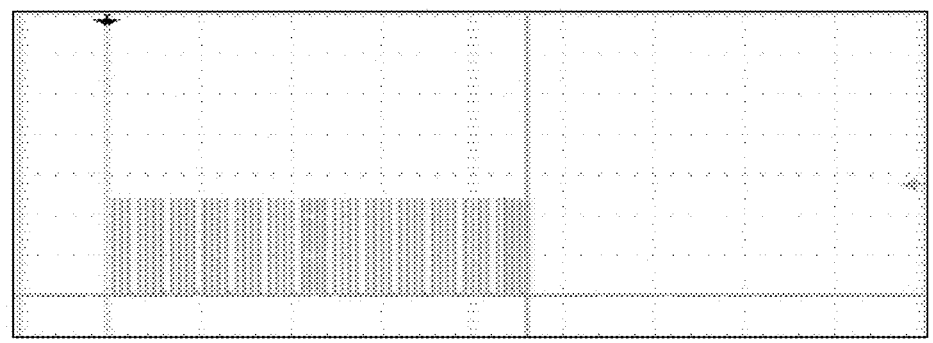
FIG. 4 is a graph depicting an exemplary pulse train for detecting a hydraulic braking system in accordance with the present disclosure.
Figure 5:
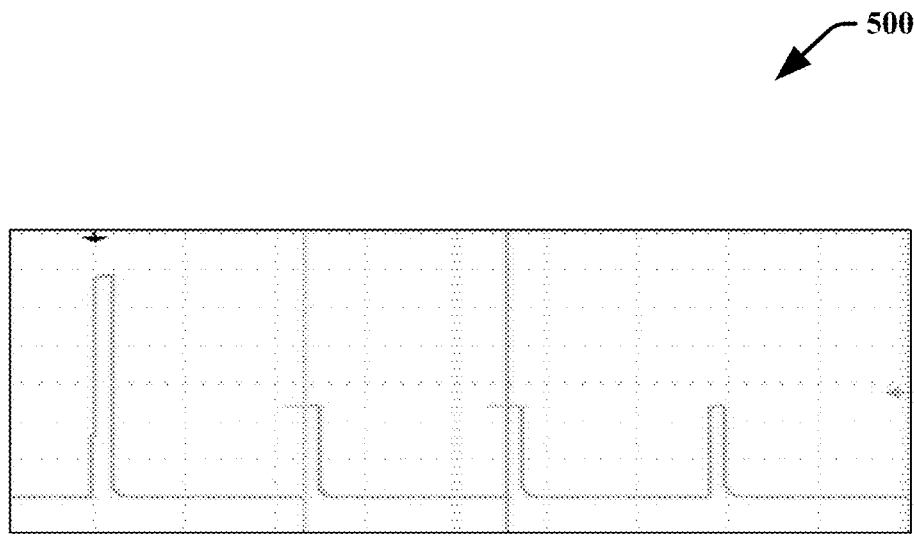
FIG. 5 is a graph of pulse sent by a brake controller in accordance with the present disclosure.
Figure 6:
FIG. 6 is a graph depicting pulses sent by a brake controller to detect a resistive load in accordance with the present disclosure.

Turning to FIG. 2, with reference to FIG. 1, there is an environmental view of the brake controller 102 mounted in a cab of a towing vehicle 202. The towing vehicle 202 may tow a trailer 204 that may comprise a braking system 234. The brake controller 102 controls the braking system 234 via a wired or wireless communication. For instance, the brake controller 102 may sense acceleration in different directions and may send a signal to the braking system 234 to induce the braking system 234 to brake the trailer 204.

User interface(s) 112 may comprise input or output devices as described herein. For example, the user interface(s) 112 may include push buttons, display screen, audio input or output devices, and the like. The user interfaces(s) 112 may be coupled to the processor 104 to communicate information to or from a user. For example, the user interface(s) 112 may include a display that is controlled by the processor 104 to generate output 122 in the form of graphical information. In another instance, the user interface(s) 112 may include push buttons that receive input 120 from a user and transmit the input to 120 to the processor 104 (e.g., manual brake application, sensitivity adjustments, etc.).

In at least one embodiment, the user interface 112 may receive input that identifies a type of the trailer 204's braking system 234 (e.g., electric or EOH). The user interface 112 may communicate this information to the processor 104 for further operations. For instance, the user may select a type of braking system 234. In various embodiments, the brake controller 102 may automatically select the type of or alter the type of as described herein.

The process for detecting connectivity of electromagnetic brakes may be different than the process of detecting connectivity of EOH braking systems as described in more detail herein. As such, when set for operation of an EOH braking system, the brake controller 102 may detect whether the EOH braking system is operatively connected thereto. When set for operation of an electromagnetic braking system, likewise, the brake controller 102 may detect whether the electromagnetic braking system is operatively connected thereto.

According to at least one embodiment, the brake controller 102 may detect a type of braking system (e.g., electric of hydraulic) and/or connectivity without receiving information from a user or from other systems. In such embodiments, the brake controller 102 may execute a process to detect a first type of braking system, such as electric brakes. If the brake controller 102 does detect the first type of braking system, the brake controller 102 may identify the type and store it in memory 106. If the brake controller does not detect the first type of braking system, it may then execute a process to detect a second type of braking system, such as EOH braking systems. If the process detects the second type of braking system, the brake controller 102 may set the second type in memory 106 for future operations (e.g., future connectivity determinations). If neither are detected, the brake controller 102 may determine that no braking system is connected.

For example, the brake controller 102 may execute a process to determine whether the electromagnetic brakes are connected and if they are, the brake controller 102 may store the type in memory 106 for future operations. This process may detect connectivity based on properties of an inductance (exponential rise in current with a step voltage input) or using a voltage divider to detect the presence of low resistance of brake electromagnetics. If brakes are not detected, then the brake controller 102 may assume that electric brakes are not detected and may determine whether EOH brakes are connected. In an aspect, a resistive test is applied wherein the processor utilized an output driver circuit to apply a signal and measure resistance of the trailer brakes. EOH braking systems may have various designs and may have various resistances. Some EOH systems may be detectable with an initial resistive test while other systems have such a high resistance that the circuit may appear open. As such, the brake controller 102 may generate a pulse train to be applied to the trailer brakes. According to at least one embodiment, the brake controller 102 may recheck connectivity after applying the pulse train to the braking system, as described herein. The pulse train may charge up the EOH system if it is connected so that it responds to a resistive test pulse. If there is no connection, the pulse train does not have an EOH system which to charge.

In at least one example, the brake controller 102 may iterate a first resistive test to determine whether resistance indicates that brakes are connected. It is noted that the resistance of one electromagnetic brake is typically about 3.6 ohms per magnet. And the resistance of the hydraulic brakes may be higher than 3.6 ohms—impedance depends on design of the input circuit of the hydraulic brakes and can be high enough to look open. As such, a second test may be utilized to test for those EOH systems that have very high resistances. If it looks open, the brake controller 102 may apply the pulse train as described herein. The pulse train is designed to cause leakage to mimic resistance if the hydraulic brake system is connected. Thus, additional iteration of the resistive test after a pulse train may indicate that an EOH brake system is connected based on measured resistance after application of the pulse train.

According to some other or additional embodiments, the brake controller 102 may first run an inductive test to determine whether electronic brakes are connected. The inductive test may include the processor 104 generating a step voltage as output 122 to towed vehicle brakes. The processor 104 then monitors for an exponential rise in current as input 120. It is noted that the inductive test may or may not be performed. The inductive test may include generating a test pulse comprising one or more pulses. In an example, two pulses may be utilized. The first pulse may be a short or control pulse and the second pulse may be a longer pulse. The processor 104 may measure the slope or inductive current ramp of a response by comparison of inductive responses of the trailer brakes caused by the test pulses. In another aspect, the processor 104 may determine whether electromagnetic brakes are connected. For instance, the processor 104 may determine if the connection is open, improper, or proper. In some embodiments, the processor 104 may utilize a single test pulse and may monitor for a positive ramp to indicate proper connection.

As described herein, electromagnetic brakes typically have a known resistance. Moreover, EOH braking systems may have different resistances based on input circuits of the EOH braking systems. As such, a first resistive test may identify whether electromagnetic brakes are connected or whether some EOH braking systems are connected. If no brakes are detected, then the processor 104 may execute a second resistive test.

The first resistive test, may include monitoring resistance and determining whether the resistance of the trailer brake load is within one or more ranges. Moreover, the brake controller 100 may be filtered or debounced measured responses to reduce erroneous readings. The processor 104 monitors the measured resistance and may determine whether electromagnetic or EOH brakes are connected. In an example, if the resistance is determined to be within a first range (e.g., about 3.6 ohms per magnet), the processor 104 may determine that electromagnetic brakes are connected. If the resistance is in a second range (e.g., less than less than 55% of a voltage of a power supply, or the like) and the circuit does not appear open, then the processor 104 may determine that EOH brakes are connect. If the processor determines that the current appears open, then the processor 104 may selectively apply a pulse train as described herein.

Figure 7:
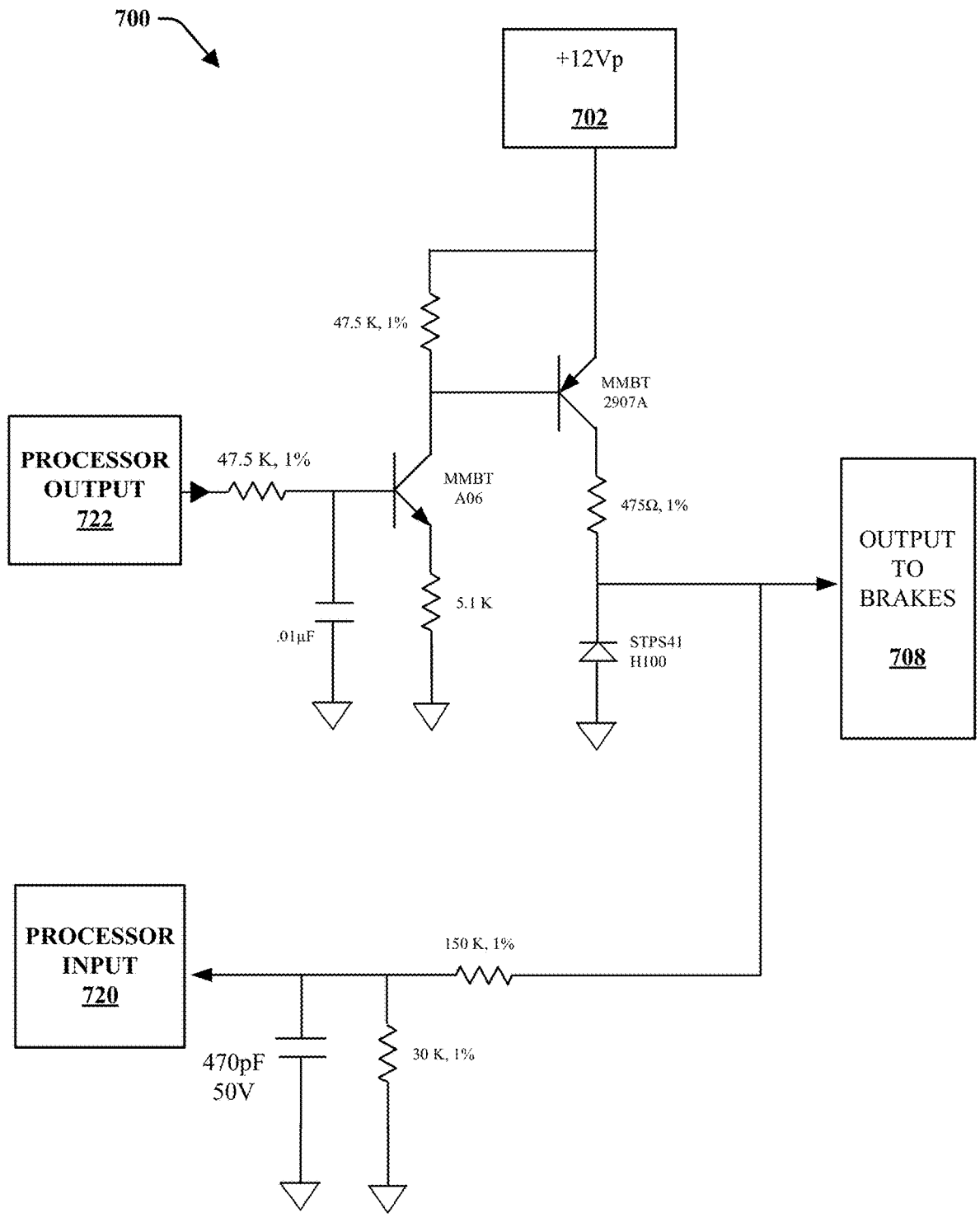
FIG. 7 is a schematic diagram of a resistive drive circuit in accordance with the present disclosure.

Turning to FIG. 7, there is an exemplary output driver circuit 700 that may be coupled to the processor 102 and operatively receiving processor output 722 and generating processor input 720. The output driver circuit 700 may include resistors, capacitors, diodes, and other circuit elements. In another aspect, the output driver circuit 700 may be coupled to a power source 702 and may be selectively coupled to towed vehicle brakes via an output terminal 708. The processor 104 may send signals to the output drive circuit 700 and may measure responses to determine brake connectivity.

With reference to FIGS. 3-6, the brake controller 102 may perform a resistive test method, as described herein, to check the trailer connectivity status. The resistive test may be performed, periodically (e.g., every k msec, where k is a number such as 100, 200, 250 etc.). A resistive pulse with a 200 μsec width may be applied and the brake controller 100 may measure a FET output voltage at the end of the resistive test pulse as shown in graph 300. If the FET output is less than 55% of Vbatt, the brake controller 102 may confirm that the EOH braking system 234 is connected. When the FET output is greater than the 60% of Vbatt, the brake controller 102 assumes that the braking system 234 is not connected as the circuit 700 may appear open as the resistance is high enough to appear open. In order to confirm the status of braking system 234 as not connected, the brake controller 102 may apply a pulse train. The pulse train, as shown in graph 400, may comprise p pulses, where p is a number, and the pulse period may comprise n ms, where n is a number. In addition, the pulse width may comprise m μs, where m is a number. For instance, the brake controller 102 may apply 50 pulses with a pulse period of 2 ms and pulse width of 100 is, repeated once every 250 msec. The total pulse train is about 50*(2 ms+100 μs)=105 ms. In an example, the period between two (100 μsec) consecutive pulses—2 msec, as shown in graph 500. The time period between two consecutive resistive pulses—250 msec, as shown in graph 600. It is noted that the above values and units of measurement are chosen for simplicity of explanation. As such, the brake controller 102 may utilize various other parameters.

According to an aspect of this disclosure, the processor 104 may automatically determine whether the brake controller 102 is connected to EOH brakes of a trailer. The brake controller 102 may generate one or more signals to be sent to the braking system 204. The brake controller 102 may measure changes in properties of the one or more signals to determine whether the braking system 204 is connected, is not connected, or other states of the braking system 204. The brake controller 102 may perform connectivity tests at different times or in different states. For instance, the brake controller 102 may perform connectivity tests during an idle mode.

Communication component 110 may comprise one or more communication devices that may receive input 120 and transmit output 122. The communication component 110 may comprise hardware, software, and/or a combination of hardware and software. According to embodiments, the communication component 110 may comprise electrical circuitry that facilitates wired or wireless communication. For example, the communication component 110 may comprise a BLUETOOTH® transmitter/receiver. In another example, the communication component 110 may comprise a wire jack, such as an Ethernet connector, USB port, or the like. It is noted that the communication component 110 may include a device that may be disposed within a housing of the brake controller 102 or may be an external device connected to the brake controller 102.

Figure 8:
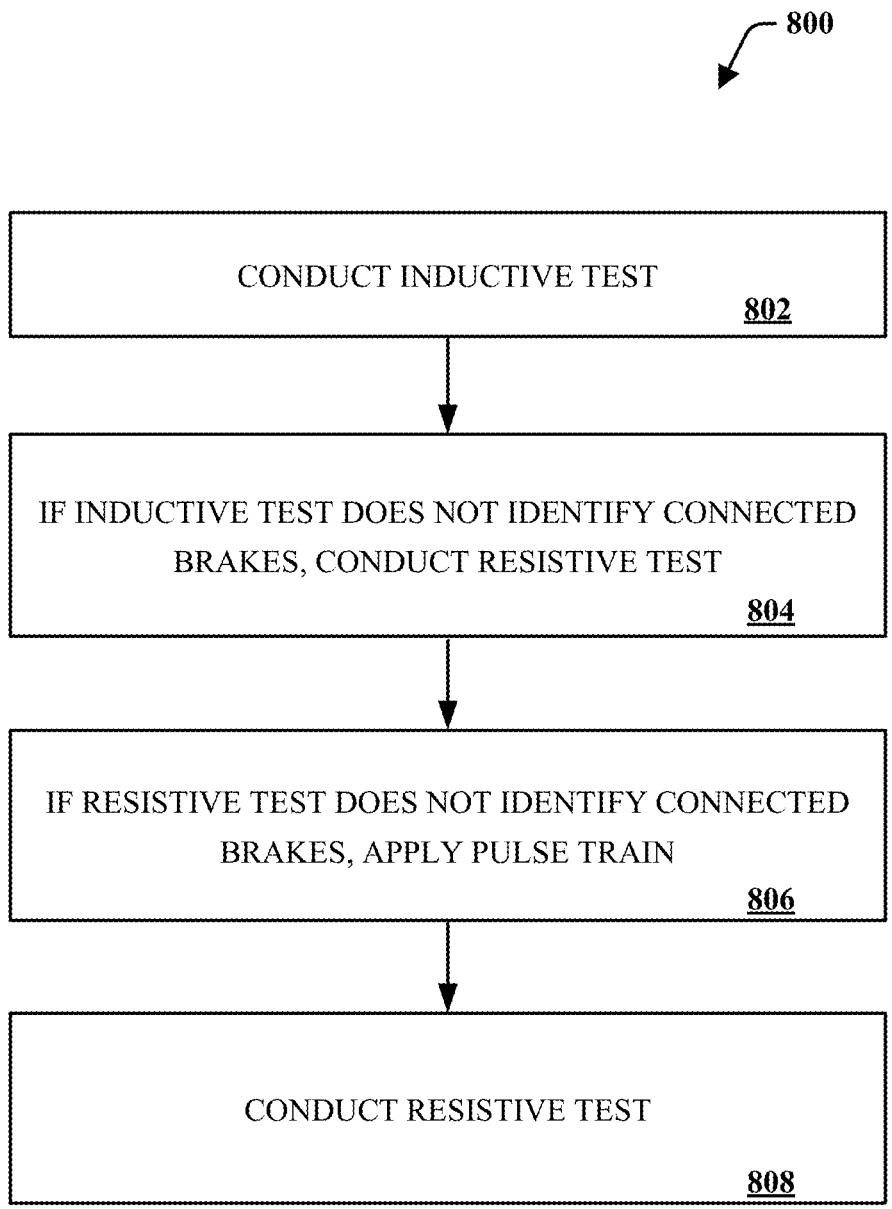
FIG. 8 is a process flow chart for determining a proper or improper connection to the trailer brakes including an inductive test in accordance with the present disclosure.
Figure 9:
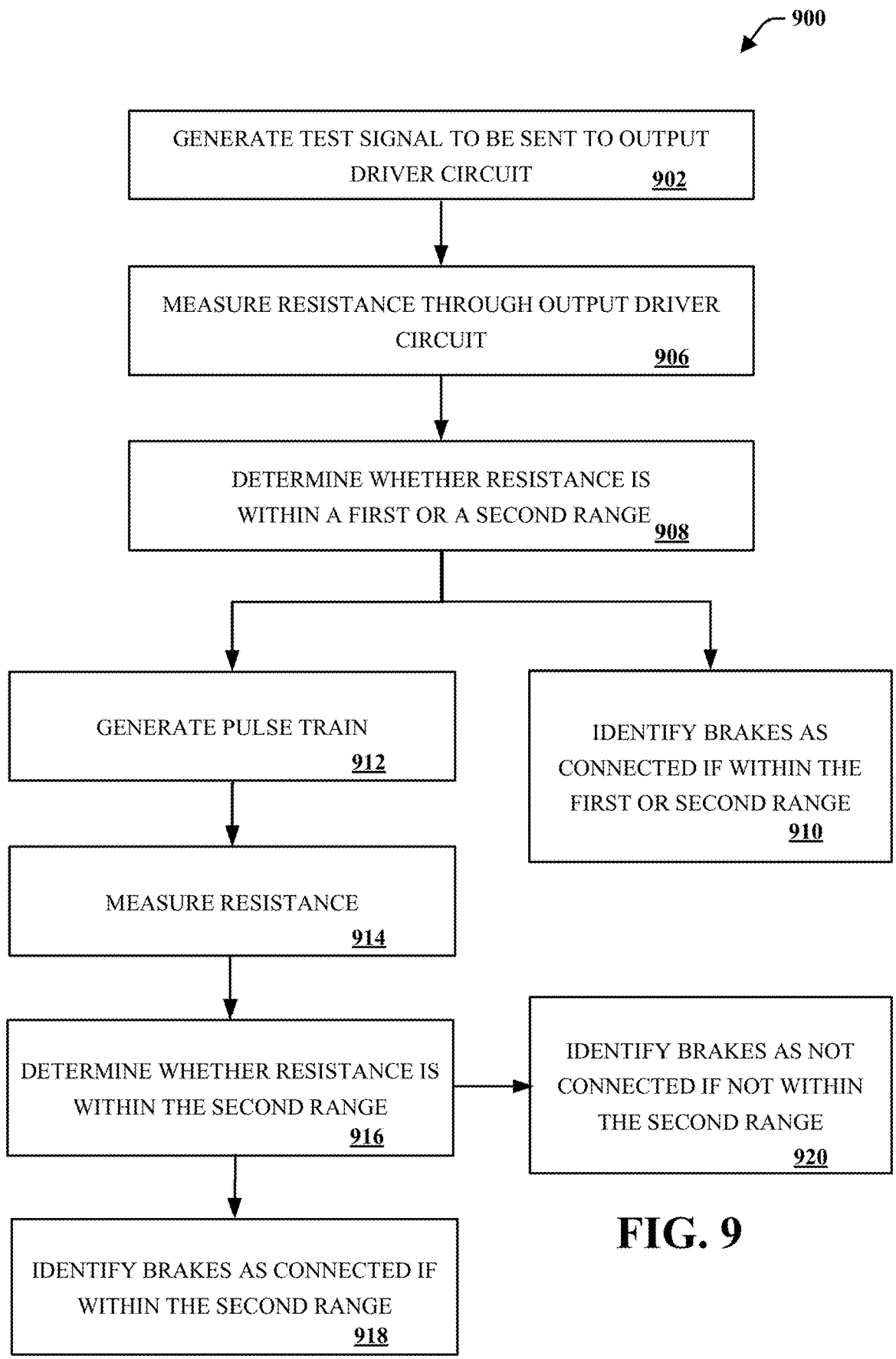
FIG. 9 is a process flow chart for determining a proper or improper connection to the trailer brakes including application of a pulse train in accordance with the present disclosure.

In view of the subject matter described herein, methods that may be related to various embodiments may be better appreciated with reference to the flowcharts of FIGS. 8-9. While the methods are shown and described as a series of blocks, it is noted that associated methods or processes are not limited by the order of the blocks. It is further noted that some blocks and corresponding actions may occur in different orders or concurrently with other blocks. Moreover, different blocks or actions may be utilized to implement the methods described hereinafter. Various actions may be completed by one or more of users, mechanical machines, automated assembly machines (e.g., including one or more processors or computing devices), or the like.

FIG. 8 depicts an exemplary flowchart of non-limiting method 800 associated with a brake control unit, according to various aspects of the subject disclosure. As an example, method 800 may conduct one or more tests to determine whether the trailer brakes are properly connected.

At 802, a processor 104 may conduct an inductive test to detect the presence of electromagnetic brakes, as described herein. The inductive test may measure induction of the brake load, if connected. It is noted that the method may stop at 802 if the processor determines that the trailer brakes are properly connected. In another aspect, 802 may be an optional action.

At 804, the processor may, when the inductive test does not identify connected brakes, conduct a resistive test as described herein. The resistive test may measure resistance of trailer brakes, if connected, in response to a test signal. It is noted that the method may stop at 804 if the processor determines that the trailer brakes are properly connected.

At 806, the processor may, when the resistive test does not identify connected brakes, generate and apply a pulse train. The pulse train may be applied to an output driver circuit that may be selectively coupled to the trailer brakes. The pulse train may charge up the trailer brakes, if connected. If no brakes are connected, the pulse train cannot charge up the trailer brakes.

At 808, the processor may conduct another resistive test 808 to measure the resistance of the trailer brakes (if connected) after application of the pulse train. As described herein, the pulse train is designed to operatively charge up the trailer brakes such that the resistance of the trailer brakes may be measured and identified if the trailer brakes are connected. The pulse train may be suited for altering the resistance of some EOH braking systems having such a high resistance that the initial resistive test induces results that make a circuit appear open. It is noted that the brake controller or processor may determine that no brakes or an improper connection to brakes is present if the second resistive test does not result in identified brakes.

Turning now to FIG. 9, there is a method 900 for determining whether the trailer brakes are connected to a brake controller without the use of an inductive test. For instance, the method 900 may detect electromagnetic brakes via a first resistive test rather than an inductive test.

At 902, a processor may generate a test signal to be sent to an output driver circuit of a brake controller. The test signal may comprise one or more pulses that may allow for measurement of resistance of the trailer brakes if they are connected. The processor may initiate transmission of electronic signals to be sent to the trailer brakes, such as at the output driver circuit and connections to the trailer brakes.

At 906, the processor may measure the resistance at the output driver circuit. As described herein, the proper connection of the trailer brakes may result in a range of resistances. At 908, the processor may determine whether the resistance is in a first range or a second range. The first range may indicate that electromagnetic brakes are properly connected and the second range may indicate that EOH brakes are properly connected. The processor may identify brakes as connected at 910 if the resistance falls within one of these ranges. It is noted that the processor may store a connection status, brake system type, or other information at memory. Moreover, the processor may instruct a display to indicate that the trailer brakes are properly connected.

The method 900 may continue to 912 if the resistance is not within the first or second range. At 912, the processor may generate a pulse train as described herein. The pulse train may be applied to an output driver that may apply the pulse train to trailer brakes if the trailer brakes are connected. This may charge up EOH trailer brake systems if they are connected.

At 914, the processor may (e.g., via or with the output driver circuit) determine or measure the resistance in response to application of the pulse train. At 916, the processor may determine whether the resistance is within the second range. The second range may correspond to a range of resistances associated with an EOH braking system after application of a pulse train.

At 918, the processor may identify brakes as connected if the resistance is withing the second range. At 920, the processor may identify the brakes as not connected if not within the second range. It is noted that the processor may indicate an improper or proper connection to a user, such as through a user interface.

As used herein, the terms "component," "module," "system," "interface," "platform," "service," "framework," "connector," "controller," or the like are generally intended to refer to a computer-related entity. Such terms may refer to at least one of hardware, software, or software in execution. For example, a component may include a computer-process running on a processor, a processor, a device, a process, a computer thread, or the like. In another aspect, such terms may include both an application running on a processor and a processor. Moreover, such terms may be localized to one computer and/or may be distributed across multiple computers.

While methods may be shown and described as a series of blocks, it is noted that associated methods or processes are not limited by the order of the blocks. It is further noted that some blocks and corresponding actions may occur in different orders or concurrently with other blocks. Moreover, different blocks or actions may be utilized to implement the methods described hereinafter. Various actions may be completed by one or more users, mechanical machines, automated assembly machines (e.g., including one or more processors or computing devices), or the like.

What is claimed is:

1. A brake controller for controlling brakes of a towed vehicle, the brake controller comprising:
   a processor that operatively initiates transmission of a test signal for testing the connectivity of the brakes of the towed vehicle to the brake controller;
   an output driver circuit operatively coupled to the processor to receive the test signal and initiate application of an electronic signal to the brakes, and to measure resistance of the brakes;
   wherein, in response to determining that the resistance is within a first range corresponding to electromagnetic brakes, the processor identifies the brakes are connected and adjusts operation of the brake controller for the electromagnetic brakes, and
   wherein, in response to the determining that the resistance is not within the first range, the processor generates a pulse train to be applied to the brakes, iterates transmission of the test signal, and in response to determining that the resistance is within a second range corresponding to electric over hydraulic (EOH) brakes, the processor identifies the brakes are connected and adjusts operation of the brake controller for the EOH brakes.

2. The brake controller of claim 1, wherein the processor identifies the brakes as not connected when the resistance is not within the first range and not within the second range.

3. The brake controller of claim 1, wherein the processor generates the pulse train with a pulse period of about 2 ms.

4. The brake controller of claim 3, wherein the processor generates the pulse train with a pulse width of about 100 µs.

5. The brake controller of claim 3, wherein the processor repeats the pulse train once every 250 ms.

6. The brake controller of claim 1, wherein the processor generates pulses of the pulse train such that the time period between consecutive pulses is about 2 ms.

7. The brake controller of claim 1, wherein the processor repeats the pulse train such that the time period between consecutive pulses is about 250 ms.

8. The brake controller of claim 1, wherein the pulse train is about 50*(2 ms+100 µs)=105 ms.

9. The brake controller of claim 1, wherein the processor measures inductance at the output driver circuit and determines whether the inductance indicates that the electromagnetic brakes are present.

10. The brake controller of claim 1, further comprising a user interface coupled to the processor and operatively indicating a connectivity status to the trailer brakes.

11. The brake controller of claim 1, further comprising a memory, wherein the processor stores a type associated with the trailer brakes in the memory.

12. A brake controller for determining connectivity of trailer brakes comprising:
   a processor; and
   an output driver circuit selectively coupled to the trailer brakes,
   wherein the processor generates a pulse train to be applied to a trailer brake system, the pulse train comprising a plurality of pulses that operatively charge an input circuit of the trailer brake system if the trailer brake system is operatively connected, and
   wherein the processor measures resistance a response at the output driver circuit after application of the pulse train to determine whether the trailer brake system is operatively connected;
   wherein:
   (A) (i) the response is a measurement of inductance, and (ii) determining that when the response corresponds to an inductance range corresponding to electromagnetic brakes, the processor identifies the brakes are connected and adjusts a transfer function of the brake controller for the electromagnetic brakes,
   (B) when the response does not correspond to the inductance range, (i) the response is a measurement of resistance, and (ii) the resistance is within a first range corresponding to electromagnetic brakes, the processor identifies the brakes are connected and adjusts the operation of the brake controller for the electromagnetic brakes,
   (C) in response to the determining that the resistance is not within the first range, (i) the response is a measurement of resistance, and (ii) when the resistance is within a second range corresponding to electric over hydraulic (EOH) brakes, the processor identifies the brakes are connected and adjusts operation of the brake controller for the EOH brakes.

13. The brake controller of claim 12, wherein the processor periodically iterates generation of the pulse train and measuring the response at the output driver circuit.

14. The brake controller of claim 12, the output driver circuit operatively receives the pulse train from the processor and applies the pulse train to a terminal connection that is operatively connected to the trailer brake system.

15. A method for determining connectivity of trailer brakes to a brake controller, the method comprising:
   generating a resistive test signal to apply to a connection terminal of an output circuit of the brake controller;
   measuring resistance at the output circuit;
   in response to determining that the resistance is within a first range corresponding to electric brakes, identifying the trailer brakes as operatively connected to electronic brakes;
   in response to determining that the resistance is not within the first range, generating a pulse train to be applied to the connection terminal of the output circuit;
   measuring resistance at the output circuit after application of the pulse train; and
   in response to determining that the resistance is within a second range corresponding to electric over hydraulic (EOH) brakes, identifying the trailer brakes as operatively connected to EOH brakes.

16. The method of claim 15, further comprising generating an inductive test signal to be applied to the connection terminal of the output circuit.

17. The method of claim 16, further comprising measuring inductance at the output circuit in response to the inductive test signal and determining whether the trailer brakes are properly connected.

18. The method of claim 15, further comprising indicating a connectivity status of the trailer brakes through a user interface.

19. The method of claim 15, further comprising storing a type associated with the trailer brakes in response to determining that the trailer brakes are operatively connected.

20. The method of claim 15, wherein in response to identifying the trailer brakes as operatively connected to electronic brakes, adjusting a transfer function of the brake controller for the electromagnetic brakes, and wherein in response to identifying the trailer brakes as operatively connected to EOH brakes, adjusting a transfer function of the brake controller for the EOH brakes.

\* \* \* \* \*